United States Patent [19]

Tam et al.

[11] Patent Number: 4,961,002
[45] Date of Patent: Oct. 2, 1990

[54] SYNAPSE CELL EMPLOYING DUAL GATE TRANSISTOR STRUCTURE

[75] Inventors: Simon M. Tam, Redwood City; Mark A. Holler, Palo Alto; Hernan A. Castro, Shingle Springs, all of Calif.

[73] Assignee: Intel Corporation, Santa Clara, Calif.

[21] Appl. No.: 419,685

[22] Filed: Oct. 11, 1989

Related U.S. Application Data

[63] Continuation-in-part of Ser. No. 379,933, Jul. 13, 1989.

[51] Int. Cl.$^5$ ............................................. H03K 19/21
[52] U.S. Cl. ................................... 307/201; 365/185; 364/513; 364/807
[58] Field of Search ................ 307/201, 450; 364/513, 364/807; 365/185; 357/23.5

[56] References Cited

U.S. PATENT DOCUMENTS

| | | | |
|---|---|---|---|
| 4,387,444 | 6/1983 | Edwards | 365/185 X |
| 4,417,264 | 11/1983 | Angle | 365/185 X |
| 4,468,574 | 8/1984 | Engeler et al. | 307/450 X |
| 4,628,487 | 12/1986 | Swayling | 365/185 |
| 4,660,166 | 4/1987 | Hopfield | 364/807 |
| 4,695,979 | 9/1987 | Tuvell et al. | 365/185 |
| 4,802,103 | 1/1989 | Faggin et al. | 364/513 |
| 4,904,881 | 2/1990 | Castro | 307/201 |
| 4,924,119 | 5/1990 | Lee | 307/450 X |

OTHER PUBLICATIONS

Hollis & Paulos, "Artificial Neurons Using Analog Multipliers", N.C. State University Manuscript Rec'd Dec. 1988.
VLSI for "Artificial Intelligence" by Jose G. Del Gado and Will R. Moore, Kluwer Academic Publishers, 1989, pp. 230–233.
"Programmable Analog Synapses for Micro Electronic Neural Networks Using a Hybrid Digital–Analog Approach" by F. J. Mack et al., IEEE International Conference on Neural Networks, Jul. 24–27, 1988, San Diego, Calif.
"A Pipelined Associative Memory Implemented in VLSI" by Clark et al., IEEE Journal of Solid-State Circuits, vol. 24, No. 1, pp. 28–34, Feb. 1989.

*Primary Examiner*—David Hudspeth
*Attorney, Agent, or Firm*—Blakely, Sokoloff, Taylor & Zafman

[57] ABSTRACT

A synapse cell for providing a weighted connection between an input voltage line and an output summing line having an associated capacitance. Connection between input and output lines in the associative network is made using a dual-gate transistor. The transistor has a floating gate member for storing electrical charge, a pair of control gates coupled to a pair of input lines, and a drain coupled to an output summing line. The floating gate of the transistor is used for storing a charge which corresponds to the strength or weight of the neural connection. When a binary voltage pulse having a certain duration is applied to either one or both of the control gates of the transistor, a current is generated. This current acts to discharge the capacitance associated with the output summing line. Furthermore, by employing a dual-gate structure, programming disturbance of neighboring devices in the network is practically eliminated.

16 Claims, 6 Drawing Sheets

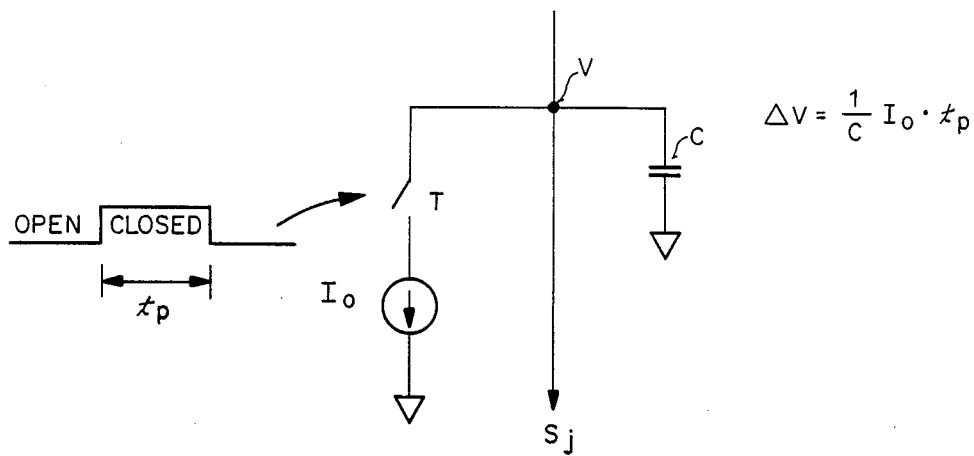
FIG_1
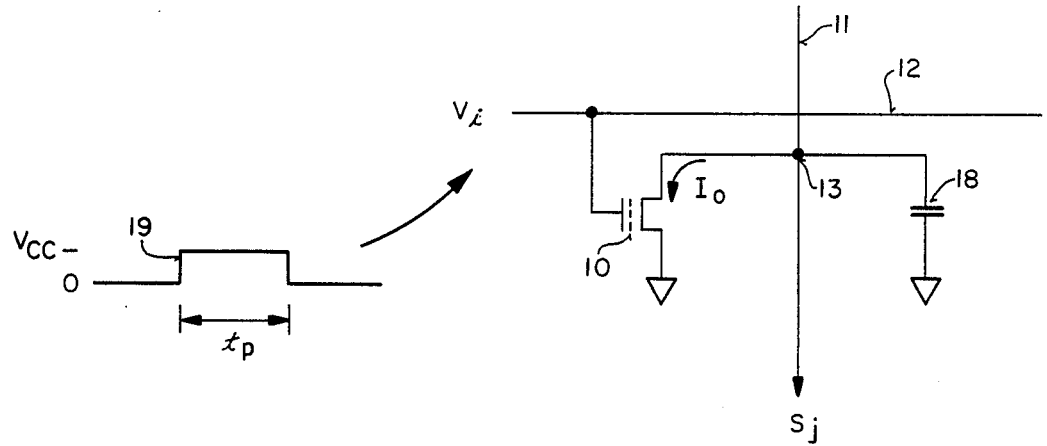
FIG_2
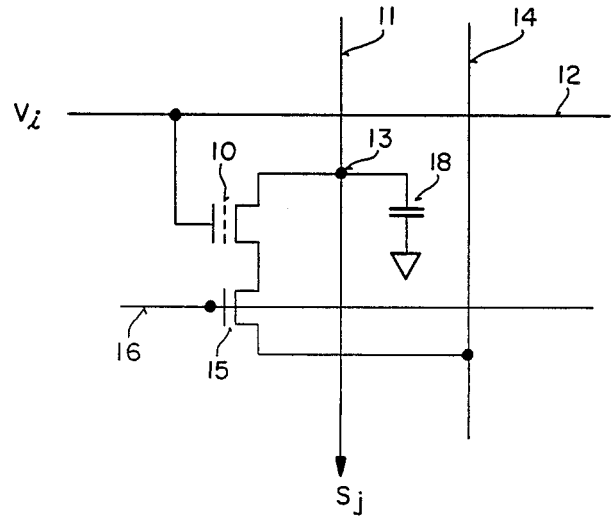
FIG_3

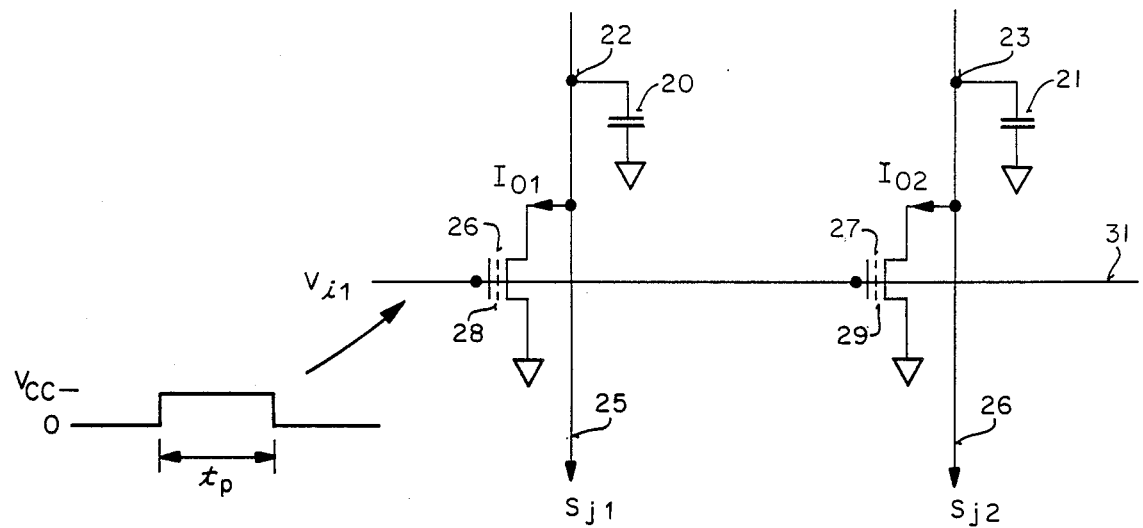
FIG_4
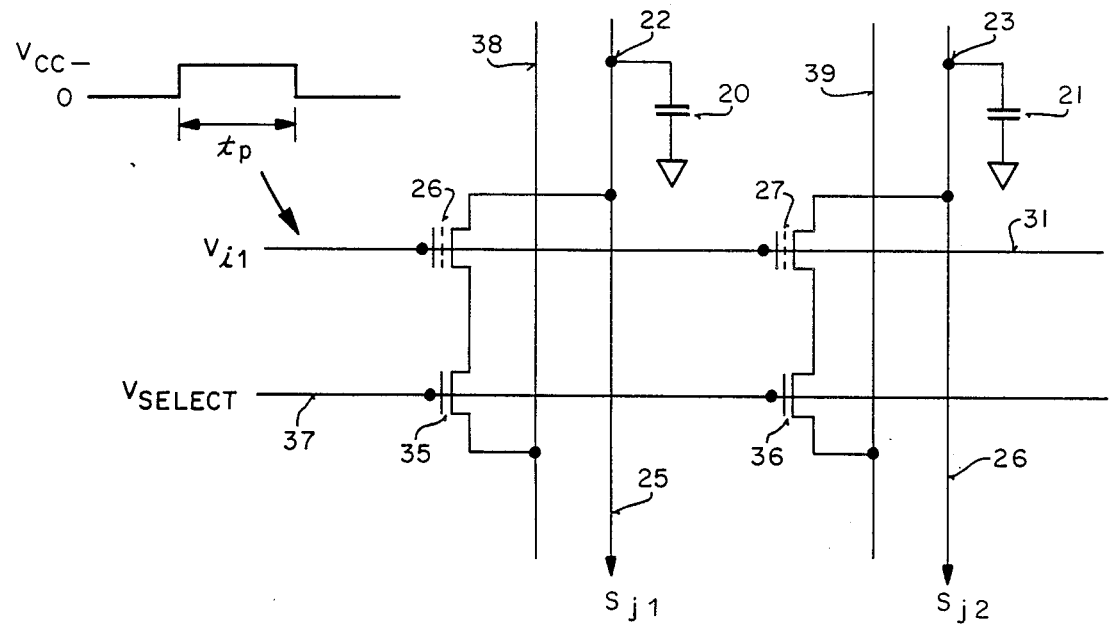
FIG_5

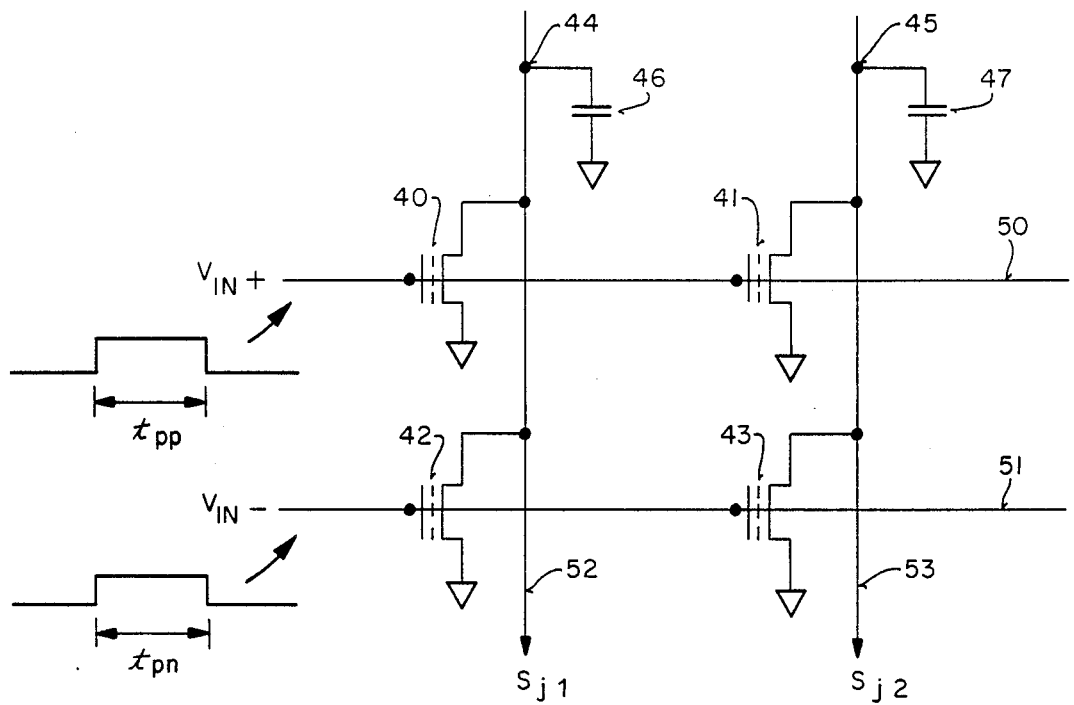
FIG_6
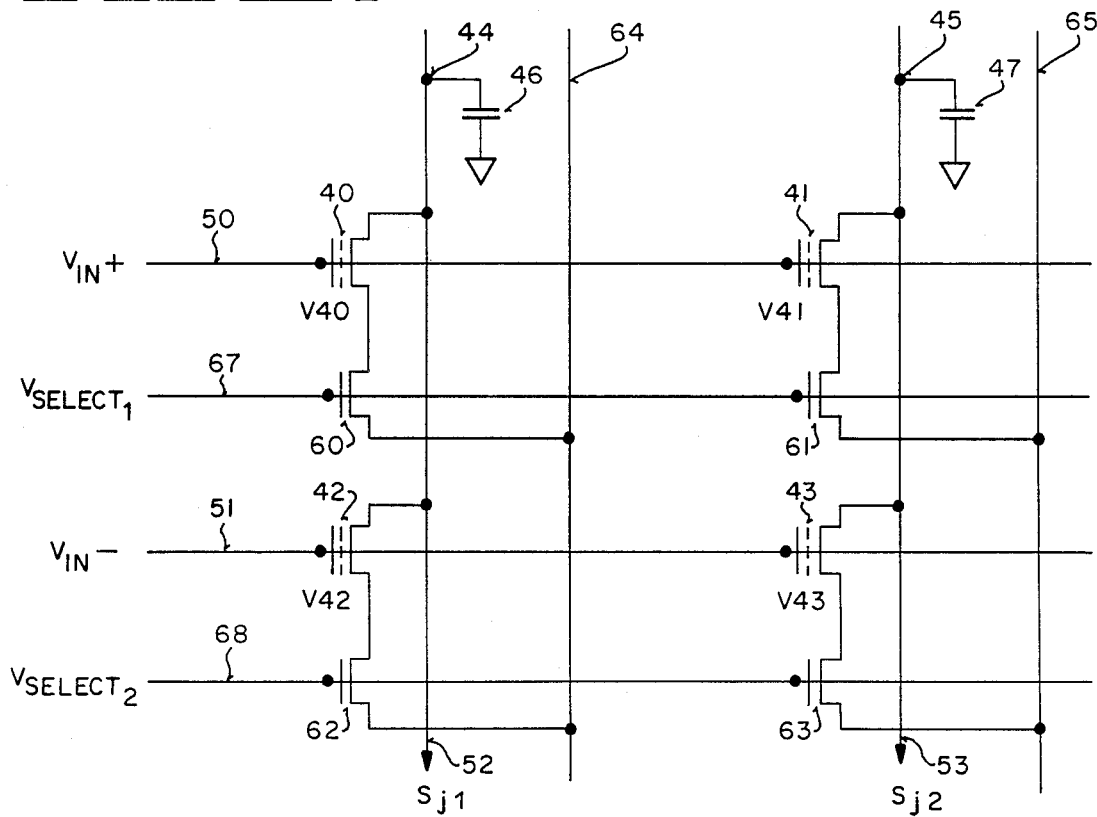
FIG_7

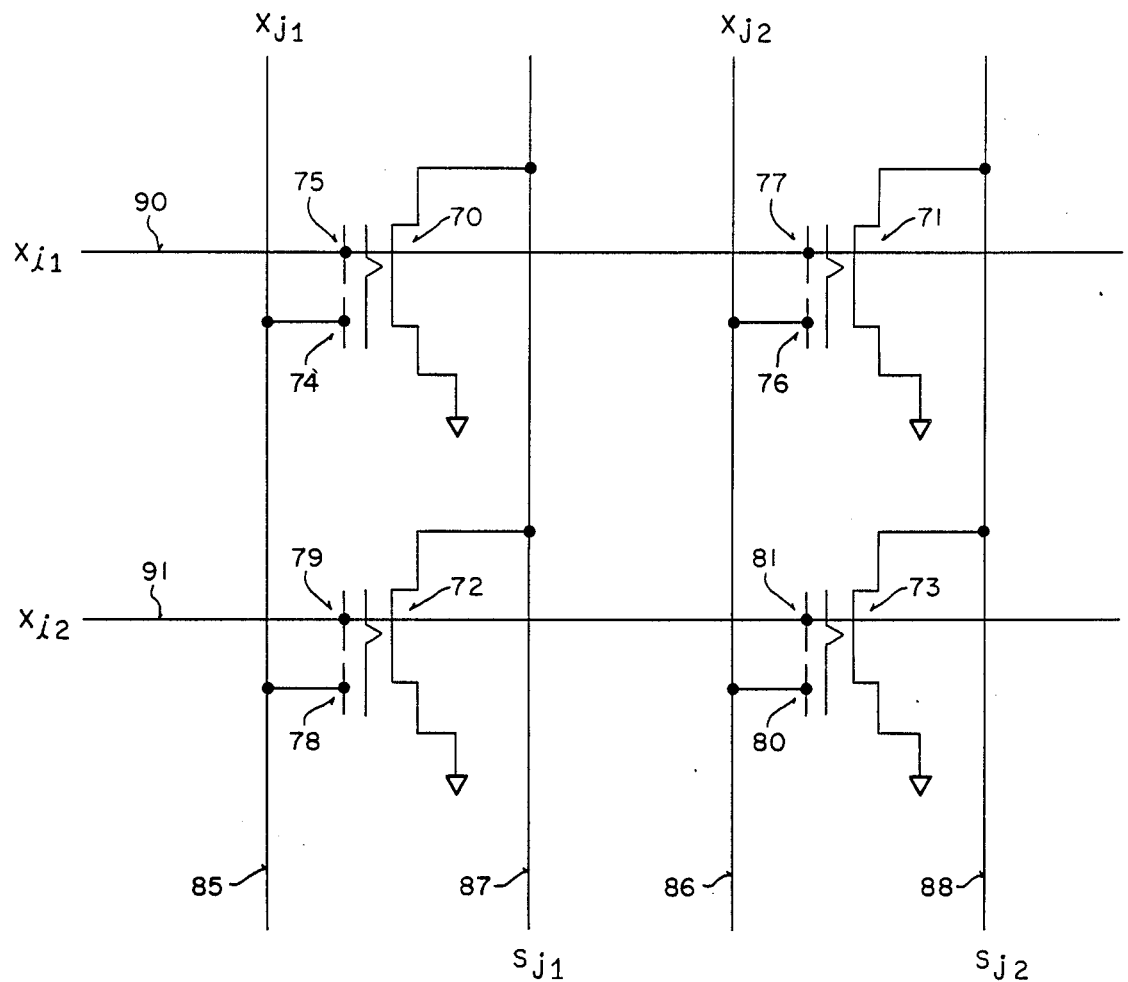
FIG_8

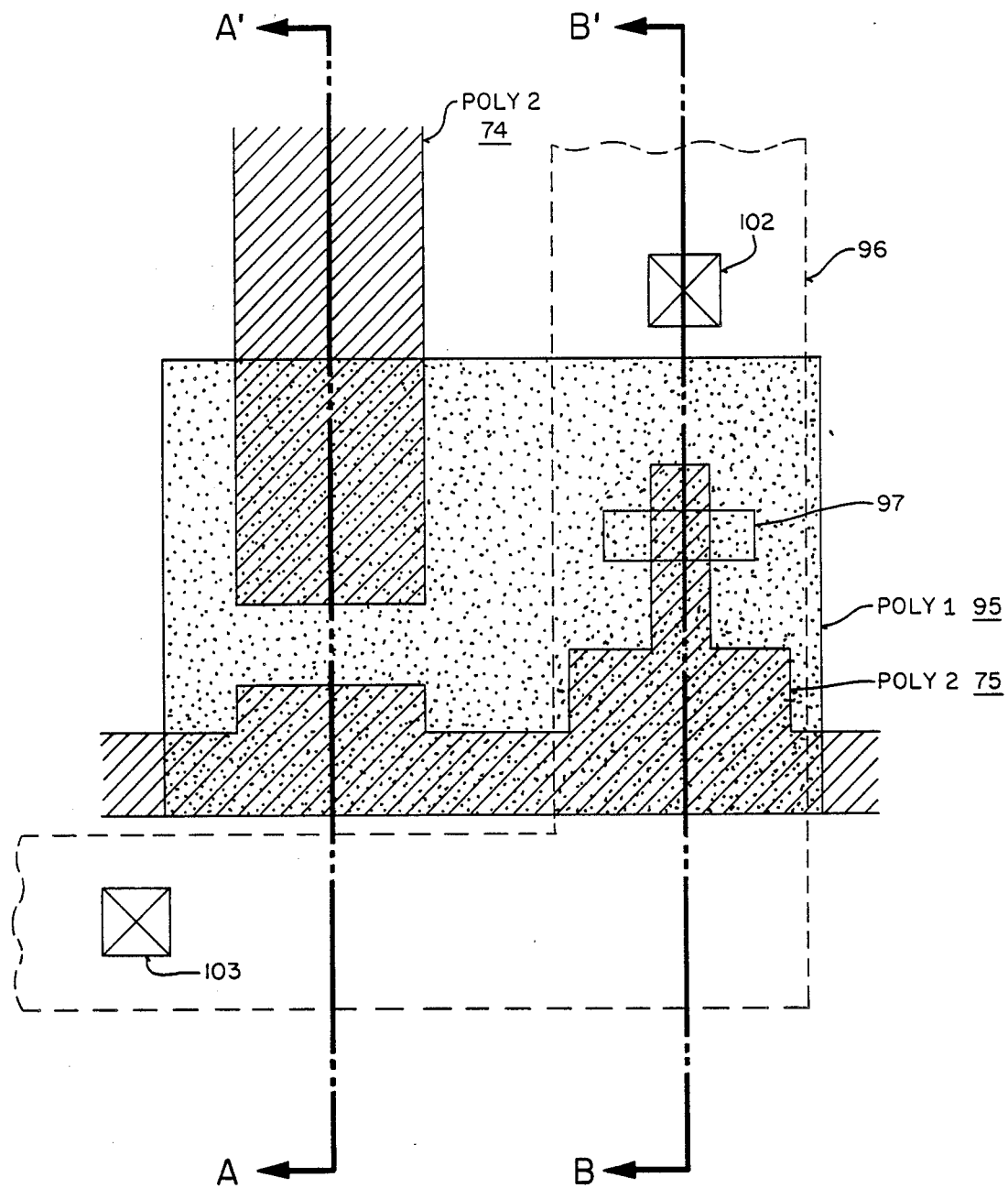
FIG_9

FIG_10A
(A-A') SECTIONAL VIEW
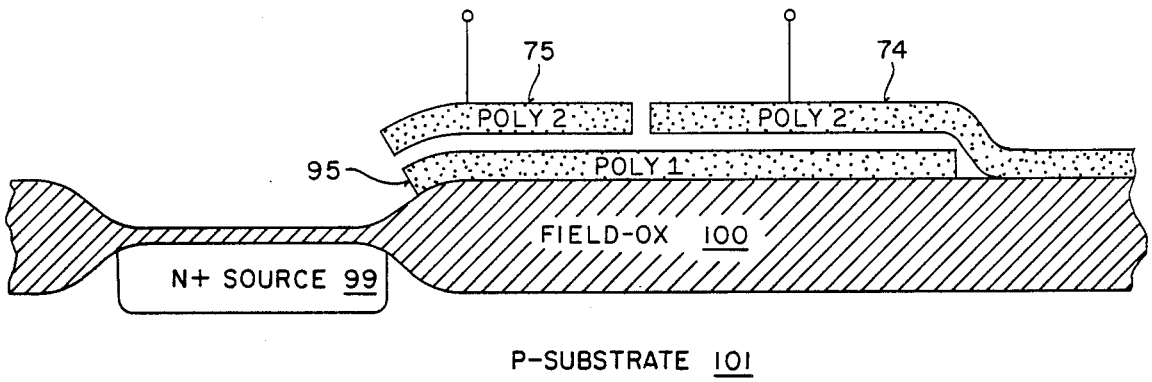
FIG_10B
(B-B') SECTIONAL VIEW
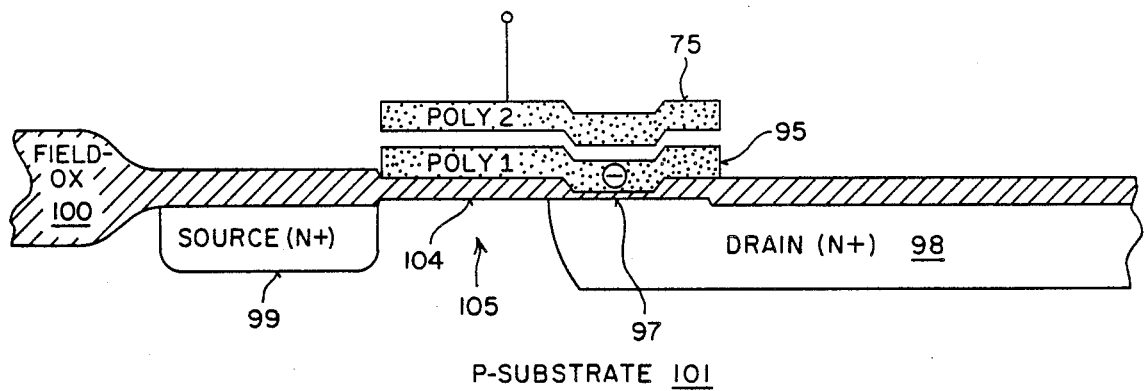

SYNAPSE CELL EMPLOYING DUAL GATE TRANSISTOR STRUCTURE

CROSS-REFERENCE TO RELATED APPLICATIONS

This application is a Continuation-in-Part application of co-pending application entitled "Adaptive Synapse Cell Providing Both Excitatory and Inhibitory Connections in an Associative Network", Ser. No. 379,933, filed Jul. 13, 1989, which application is assigned to the assignee of the present invention.

FIELD OF THE INVENTION

The invention pertains to the field of associative networks for emulating higher-order functions performed in the cortex of the human brain. More particularly, the invention pertains to synapse cells which provide a weighted connection between an input vector and a neural summing device.

BACKGROUND OF THE INVENTION

A great deal of effort has recently been focused on developing electronic circuits which emulate higher-order brain functions such as memory learning and/or perception/recognition.

One class of circuit devices which sense an input event and output a pattern of signals which identifies that event are associated networks. Association networks generally take the form of a matrix comprised of horizontal lines crossing and contacting an equally sized set of vertical lines. The horizontal lines simulate the functions of axons in the cortex of the brain and are used as inputs. The vertical lines simulate the function of dendrites extending from neurons. Each vertical line terminates at a summing device which acts to simulate the function of the neuron cell body. An example of such an associative network is found in co-pending applicaiton entitled "Semiconductor Cell For Neural Network Employing A Four-Quadrant Multiplier", Ser. No. 283,553, filed Dec. 9, 1988, which is assigned to the assignee of the present application.

Within an associative network, neural synapses are simulated by circuit cells which provide electrical connection between the horizontal and vertical lines of the network. Individual synapses provide a weighted electrical connection between an input and a summing element, i.e., a neuron body. A neuron consists of a neuron body, the synapse which modulates its inputs, and axons which distribute its output.

These synapse cells may be either analog or digital in nature. For an analog implementation, the weighted sum of input signals is usually computed by summing analog currents or charge packets. For a general description of an associative network processing unit consisting of analog connection elements, see "VLSI for Artificial Intelligence", edited by Jose G. DelGado-Frias and Will R. Moore, Kluwer Academic Publishers, 1989, pp. 230-233.

One of the most difficult and critical tasks faced by researchers in the field of neural networks is the integration of the synapse cells, also referred to as contact structures. The several realizations that have been proposed range from non-programmable binary to programmable analog interconnections.

In an analog synapse cell, considerations of cell size and resolution of the connection weight must be carefully balanced. Furthermore, learning within an associative network requires adaptive weight values since a typical network system cycles through a series of weight changes until the entire network converges to a certain pattern which depends upon the pattern of inputs applied. Several synapse cell circuits are described in co-pending applications "EXCLUSIVE-OR Cell For Neural Network Cell And The Like", Ser. No. 309,247, filed Feb. 10, 1989; and "EXCLUSIVE-OR Cell For Pattern Matching And Employing Floating Gate Devices", Ser. No. 325,380, filed Mar. 17, 1989, both of which are assigned to the assignee of the present application.

FIG. 2 of U.S. Pat. No. 4,802,103 of Faggin et al., discloses a contact structure which utilizes a floating gate transistor 34. Device 34 is used to discharge a target line of the network in proportion to the amount of charge stored on the floating gate member of device 34. The magnitude of the convergence response of the network is altered by incrementally erasing the floating gate transistors. In other words, the connection strength is increased to increase the discharge current associated with the target line. A detecting circuit indicates a convergence response once a predetermined amount of charge is removed from the target line.

The chief drawback of the contact structure of Faggin's FIG. 2 is that it operates as a simple one-quadrant device. That is, Faggin's synapse cell only produces a positive activation function, corresponding to an activated excitatory connection. It is well understood that biological memories accommodate both excitatory and inhibitory connections—thus providing both positive and negative responses. A cell providing both excitatory and inhibitory connections would more closely resemble the actual function performed by a synapse within the human brain. Moreover, such a cell would have the potential to learn quicker, thereby providing faster convergence within an associative network. What is needed therefore is an integrated multi-quadrant synapse cell which can produce both positive and negative responses.

As will be seen, the present invention covers a synapse cell employing one or more floating gate transistors. Various embodiments of the invention offer the advantage of multi-quadrant performance which provides the ability to make inhibitory as well as excitatory connections within an associative network. Furthermore, the cell of the present invention achieves very high densities while still providing full incremental learning capabilities.

Other prior art known to Applicant includes: U.S. Pat. No. 4,760,437 of Denker et al.; U.S. Pat. No. 4,660,166 of Hopfield; U.S. Pat. No. 4,782,460 of Spencer, "Programmable Analog Synapses For Micro Electronic Neural Networks Using A Hybrid Digital-Analog Approach", by F. J. Mack et al., *IEEE International Conference on Neural Networks*, Jul. 24-27, San Diego, Calif.; and "A Pipelined Associative Memory Implemented in VLSI", by Clark et al., *IEEE Journal of Solid-State Circuits*, Vol. 24, No. 1, pp. 28-34, Feb. 1989.

SUMMARY OF THE INVENTION

The present invention covers a dual-gate synapse cell for providing a weighted connection between an input line and an output summing line having an associated capacitance. Connection between input and output lines in the associative network is made using a floating gate transistor wherein the transistor's dual control gate is coupled to the input line and its drain is coupled to the output line. The output summing line in an associative network is usually connected to a voltage sensing element, such as a non-linear amplifier, which simulates the function of the neuron body in a biological neuron.

The floating gate of the transistor is used for storing a charge which corresponds to the strength or weight of the neural connection. When a binary voltage pulse having a certain duration is applied to the control gate of the floating gate transistor, a current is generated. This current acts to discharge the capacitance associated with the output summing line. Since the current, and therefore the resulting discharge, is directly proportional to the charge stored on the floating gate member and the duration of the input pulse, the synapse cell of the present invention performs a multiplication function.

Furthermore, by employing a dual-gate structure, programming disturbance of neighboring devices in the network is practically eliminated.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 1 shows a basic circuit model of a contact structure which emulates the function of a synapse in the cortex of the human brain.

FIG. 2 shows a synapse cell employing a single floating gate transistor.

FIG. 3 illustrates the one-quadrant synapse cell of FIG. 2 also having an additional transistor to facilitate selective programming/erasing.

FIG. 4 shows a synapse cell which provides two-quadrant multiplication of an input voltage and a stored weight.

FIG. 5 shows the two-quadrant cell of FIG. 4 with additional transistors incoporated to facilitate selective programming/erasure.

FIG. 6 illustrates a four-quadrant synapse cell connecting a differential input to a differential output summing line.

FIG. 7 shows the four-quadrant cell of FIG. 6 incoporating additional transistors to facilitate selective programming/erasure.

FIG. 8 illustrates the currently preferred embodiment of the present invention.

FIG. 9 shows a cross-sectional view of the dual-gate device structure employed in the present invention.

FIGS. 10A and 10B show a top view of the dual-gate device structure employed in the currently preferred embodiment of the present invention.

DETAILED DESCRIPTION OF THE PREFERRED EMBODIMENT(S)

Referring to FIG. 1, there is shown a basic circuit model of a contact structure which emulates the function of a synapse in the human brain (for reference, see p. 104 of "Principles of Neuroscience" by Kandell & Schwartz, 2nd ed., Elsevier). The circuit of FIG. 1 includes an analog current summing line $S_j$ which terminates at the input of a neural summing device. Line $S_j$ carries the sum of the individual current contributions of each of the synapse cells associated with that line. Line $S_j$ is shown having a capacitance C coupled to node V. Also connected to node V is a switched current source supplying a constant current of $I_0$ when switch T is closed. The circuit of FIG. 1 is activated during the time interval $t_p$ when switch T is closed.

As would be evident to one skilled in the art, the circuit of FIG. 1 is a basic capacitive discharging circuit. A predetermined amount of charge stored on capacitor C is drained in direct proportion to the product of the current $I_0$ and the time interval $t_p$. Thus, using the basic contact structure of FIG. 1, an input signal in the form of a switch closing for a controlled period of time produces a charge displacement from node V which may then be totaled with other charge displacements simply by coupling one terminal of each contact structure to node V.

The change in voltage which occurs at node V in response to a switch closing is a multiple of the current $I_0$ (i.e., stored weight) and the time period $t_p$ (i.e., the input to the neuron), as given by the equation $$\Delta V = \frac{1}{C} I_0 t_p \quad (1)$$

The total voltage change on node V for i inputs connected through i contact structures to node V is written as $$\Delta V_{TOT} = \sum_i \frac{1}{C} I_{0i} t_{pi} \quad (2)$$

where each $I_{0i}$ and each $t_{pi}$ are independent. The electrical function given by equation (2) by practioners in the art as the dot product vector calculation, and is one of the more common calculations used in modelling the function of a biological neuron (see "Parallel Distributed Processing" by Rummelhart & McClellan, Vol. 1, Chapter 2). The dot product is conventionally represented as $$\text{Dot product} = \bar{v} \cdot \bar{w} = \sum_i v_i \cdot w_i \quad (3)$$

where $\bar{v}$ and $\bar{w}$ denote the input vector and stored weight, respectively. A current source is used instead of a resistor to make each charge displacement independent of the voltage on node V. This is to prevent any input from being dependent on the effect of any other input.

A simple learning rule (frequently referred to as Hebbian learning) for programming the contact structure of FIG. 1 is to increase the current $I_0$ for all contacts coupled to an active input line and a summing line from which a response is desired. This has the effect of strengthening the synaptic connection. Other learning rules, e.g., Back Propagation, may also be used to set the $I_0$ values to obtain a desired response from a neuron body.

FIG. 2 illustrates a good functional integration of the contact structure represented by the circuit model of FIG. 1. In FIG. 2, the constant current source $I_0$ is realized by an MOS transistor 10 which has a floating gate member that is electrically chargeable. Most often, transistor 10 is fabricated with a polysilicon floating gate which is completely surrounded by insulation (e.g., silicon dioxide). Charge is transferred out of the floating gate through a variety of mechanisms such as avalanche injection, channel injection, tunneling etc. It is the charge on the floating gate which affects the conductivity of the device. If the conductivity is above a certain level, the device is deemed to be progammed in one binary state. If the conductivity is below another level, it is deemed to be programmed in the other binary state. For analog applications, the floating gate charge is controlled to provide intermediate levels of conductivity between upper and lower limits.

Floating gate transistors take a variety of forms in the prior art, some being both electrically erasable and electrically programmable and others requiring, for example, ultra violet for erasing. These non-volatile storage devices are frequently referred to in the prior art as EPROMs, EEPROMs or flash EEPROMs. The currently preferred embodiment of the present invention employs standard flash EPROM devices augmented with ordinary select transistors, although standard EEPROMs or EPROMs may be readily substituted without detracting from the spirit or scope of the present invention.

With reference to FIG. 2, the application of an input voltage pulse having a non-zeo, predetermined duration $t_p$ to input line 12 (labeled $V_i$) causes a current $I_0$ to flow in transistor 10. The magnitude of the current $I_0$ depends on the stored charge programmed onto the floating gate of transistor 10. As is shown, the control gate of device 10 is coupled to input line 12, the drain of device 10 is coupled to node 13 of line 11 and the source is grounded. The current $I_0$ acts to incrementally discharge capacitor 18 connected to line 11 at node 13. According to equation (1), this causes a corresponding change in the voltage present on line 11.

Consider in more detail the case wherein an input voltage pulse of a certain duration $t_p$ is applied to input line 12. The value of the input voltage is digital in nature, assuming either a value of 0 volts or the supply potential, e.g., $V_{CC}$. The pulse width, however, is analog in nature and is used to represent a value in a continuum of possible input values. Upon the arrival of the input pulse on line 12, floating gate transistor 10 conducts a current $I_0$. Of course, the magnitude of the current $I_0$ depends on the actual charge residing on the floating gate member of transistor 10. Preferably, transistor 10 is an n-channel device so that if a large amount of negative charge resides on the floating gate member, then the magnitude of $I_0$ will be relatively small. On the other hand, if a small amount of negative charge, or a positive charge, resides on the floating gate then the magnitude of $I_0$ will be relatively large.

As discussed, the current $I_0$ acts to drain a predetermined amount of charge from capacitor 18. It is appreciated that the charge may be stored in a variety of alternative ways. For instance, instead of using a separate storage capacitor, the parasitic capacitance associated with line 11 may itself be used to store the charge.

During the time that input line 12 is high, a quantity of charge is drained off of line 11 which corresponds directly to the product of the current $I_0$ and the time period $t_p$. The voltage at node 13 drops accordingly. Hence, the invented synapse cell of FIG. 2 acts as a type of one-quadrant multiplier—providing an output which depends upon the product of an input pulse width and the amount of charge stored on the floating gate of transistor 10 (i.e., the stored charge on the floating gate representing the adaptive weight).

Use of pulse widths to represent inputs to the synapse cell is more power efficient than conventional voltage level-sensing schemes because current flows only during the active portion of the pulse width, i.e., when the pulse is "high". Therefore, quiescent power consumption in the cells is markedly reduced.

To reduce transient current spikes, the leading edge transitions 19 (see FIG. 2) of the input pulses applied to the various synapses may be randomly skewed in time with respect to one another. One way to accomplish this would be to utilize a high-speed free-running clock to drive a counter which would then trigger the various transition points of the input pulses. In this way, the input pulses would be applied relatively asynchronously with respect to the other pulses; never allowing a multitude of transitions to occur at the same time. If a plurality of input pulses were synchronized so that their leading edge transitions 19 occurred simultaneously, large transient currents would result. Obviously, such currents are undesirable. Note that the human brain generates pulses which are asynchronous, possibly for the same reason.

Programming and erasing of the cell of FIG. 2 can be accomplished in the manner well-known in the prior art. For example, in the case in which flash EPROM devices are employed, device 10 may be programmed by taking its control gate (connected to input line 12) and its drain (connected to summing line 11) to a high positive potential. High positive voltages on the control gate and drain of device 10 cause hot-electrons to be injected onto the floating gate, thereby raising its threshold and decreasing the current $I_0$.

All of the floating gate transistors within the associative network can be erased simultaneously by raising the common source to a high positive potential as is typically done in flash EPROM devices. For instance, to erase transistor 10, the control gate connected to line 12 is taken to a voltage at or near ground potential. The application of a high positive potential to the common source, while its control gate is grounded, causes electrons to tunnel from the floating gate to the source. This "erase process" reduces the threshold of the floating gate transistor while increasing the current $I_0$.

To erase floating gate devices within a synapse cell more selectively, a separate source select field-effect device is required. Such a circuit configuration which includes a source select field-effect device 15 is shown in FIG. 3. Device 15 comprises an ordinary n-channel MOS transistor. When the select line 16, coupled to the gate of device 15, is raised to a high positive potential, the source of transistor 10 is electrically coupled to line 14. A high positive programming potential (e.g., $V_{pp}$) is then applied to the source of floating gate device 10 via line 14. During a selective erase, all of the other select lines within the network will generally be grounded. In a normal read or association operation, all of the select lines in the network are taken high and their associated programming potential lines (e.g., line 14) are grounded.

The addition of select device 15 roughly doubles the cell size of the connection element; however, device 15 does add the ability to change the stored weight in either direction, i.e., either positive or negative. For instance, the weight stored in device 10 may be either increased, by incremental programming (i.e., charging) of the floating gate member of device 10, or decreased by incrementally erasing (i.e., discharging) device 10. Most learning algorithms of which Applicant is aware require incremental weight changes in both directions. Thus, the inclusion of device 15 is highly desirable except in those cases where a predetermined weight matrix is to be programmed into the device.

Because the cortex of the human brain provides for both excitatory and inhibitory connections, an accurate synapse implementation must be able to produce positive as well as negative responses. This means that the synapse cell must be capable of either two-quadrant or four-quadrant multiplication. It has been shown that inhibitory connections are necessary for a neural network to be fully general for mapping input patterns to output patterns.

The synapse cell of FIG. 4 implements a two-quadrant multiply in which a differential voltage is produced in response to an input voltage pulse. The cell includes two floating gate transistors 26 and 27 each having a corresponding floating gate member 28 and 29, respectively. Transistor 26 has its drain coupled to current summing line 25 (labeled $S_{j1}$) while transistor 27 has its drain coupled to current summing line 26 (labeled $S_{j2}$). Both transistors have their sources coupled to a reference potential, e.g., ground. The capacitances associated with lines 25 and 26 are represented in FIG. 4 by capacitors 20 and 21, coupled to nodes 22 and 23, respectively. The other plate of each capacitor is grounded. (It is understood, of course, that the actual implementation of capacitors 20 and 21 may take a variety of forms, as mentioned above).

A bipolar weight pattern (the term "bipolar" in this context refers to the ability of the weight to be either excitatory or inhibitory) is stored in the cell of FIG. 4 by programming different voltages onto floating gate members 28 and 29. By way of example, a positive weight may be defined by a voltage $V_{28}$ on floating game member 28 which is greater than a voltage $V_{29}$ stored on floating gate member 29. Logically, a negative weight is then defined by the case in which $V_{29}$ is greater than $V_{28}$.

Upon the application of a voltage input pulse of duration $t_p$, each floating gate transistor conducts a current which is directly related to the stored weight. For instance, for the case in which positive weight has been programmed (i.e., $V_{28} > V_{29}$) the current $I_{01}$ is made larger than the current $I_{02}$. Therefore, the change in the voltage associated with the voltage at node 22 will be greater than the change in voltage at node 23 (i.e., more electrical charge will be removed from capacitor 20 than from capacitor 21). This result may be conventionally defined as a positive output response. A negative output response would result whenever $I_{02}$ is greater than $I_{01}$, with capacitor 21 discharging more than capacitor 20 (assuming, of course, that capacitors 20 and 21 have equal values). Thus, the cell of FIG. 4 is capable of producing both excitatory and inhibitory connections to a neural summing device.

Referring now to FIG. 5, the two-quadrant synapse cell of FIG. 4 is shown incorporating additional transistors 35 and 36 to facilitate selective programming and erasing of floating gate devices 26 and 27. Select transistors 35 and 36, which in the preferred embodiment are ordinary n-channel MOS devices, both have their gates coupled to select line 37 and their drains coupled to the sources of floating gate transistors 26 and 27, respectively; their sources are coupled to common source lines 38 and 39, respectively.

As described in conjunction with FIG. 3, the addition of select devices 35 and 36 adds the ability to alter, or adapt, individual stored weights in either a positive or negative direction. This gives the synapse cell of FIG. 5 the potential for faster learning (i.e., quicker convergence response) when compared to simpler structures.

It is appreciated that by using time integration techniques the need for precise matching of the transistor devices is considerably relaxed. As long as the current flowing through each of the floating gate devices remains constant during the time $t_p$, the multiplication process will be linearly precise (assuming, of course, that the associated summing line capacitance is itself linear). Further, by providing the capacity for incremental programming and erasing through the use of select devices 35 and 36, the circuit of FIG. 5 supports full incremental learning in an associative network.

A synapse capable of full four-quadrant multiply is important because it allows representation of input vector components in the range from $-1$ to $+1$ instead of from 0 to $+1$. Generally, the length (i.e., magnitude) of vectors with components in the range from $-1$ to $+1$ is nearly constant while the length of vectors with components in the range from 0 to $+1$ varies considerably. Neurons which carry out a dot product calculation can more reliable learn to recognize different pattern vectors of equal lengths as opposed to vectors of different lengths.

Full four-quadrant multiplication is achieved by using differential input and output lines as shown in FIG. 6. The synapse cell of FIG. 6 comprises input lines 50 and 51 coupled to the gates of floating gate transistors 40, 41 and 42, 43, respectively. The drains of transistors 40 and 42 are coupled to current summing line 52 (labeled $S_{j1}$), while the drains of devices 41 and 43 are coupled to current summing line 53 (labeled $S_{j2}$). Summing line 52 has an associated capacitance 46 coupled at node 44 and current summing line 53 has a similar capacitance 47 coupled at node 45. As is shown, the other side of each capacitor is coupled to ground. Likewise, the source of each transistor in FIG. 6 is coupled to a reference potential (e.g., ground).

For positive inputs, a voltage pulse having a time period $t_{PP}$ is supplied to line 50, for example, while for negative inputs, a voltage pulse of time period $t_{PN}$ may be applied in input line 51. As before, the length or duration of the pulse is proportional to the magnitude of the input. The current produced through the floating gate devices is a product of the input pulse duration and the stored weight pattern in devices 40–43. Note that only one input voltage pulse is applied to the cell of FIG. 6 for a given input. In other words, the positive input has a pulse applied to lines 50 while line 51 remains grounded. Conversely, a negative input would have a pulse applied to line 51 while line 50 remains grounded. It should be understood that this method of applying inputs to one line at a time is not a strict requirement. Both positive and negative values can be represented in a situation in which both lines are active.

The floating gate potentials are represented in FIG. 6 by the voltages of $V_{40}$–$V_{43}$, corresponding to the floating gate transistors 40–43. A negative weight pattern may be defined for the case in which $V_{41}$ is greater than $V_{40}$ and $V_{42}$ is greater than $V_{43}$. For this situation, when a positive input is applied (i.e., $t_{PP} > 0$ and $t_{PN} = 0$) more current will flow through the floating gate transistor 41 relative to transistor 40. Therefore, the change in voltage produced at node 45 due to the discharge of capacitor 47 will be greater than the change in voltage produced at node 44 from the discharge of capacitor 46. This output condition in FIG. 6 may be arbitrarily defined as a negative output response. Logically, a positive output response would then correspond to the situation in which the change in voltage produced at node 44 was greater than the change in voltage produced at node 45.

Consistent with the convention described, a positive stored weight pattern would correspond to the situation in which the voltage $V_{40}$ is greater than $V_{41}$ and $V_{43}$ is greater than $V_{42}$. Applying a positive input (i.e., $t_{PP}>0$; $t_{PN}=0$) to the cell of FIG. 6 storing a positive weight pattern produces a discharge on line 52 which is greater relative to the discharge experienced on line 53, i.e., a positive output response. Applying a negative input (i.e., $t_{PP}=0$; $t_{PN}>0$) to the cell of FIG. 6 storing a positive weight produces a discharge on line 53 which is greater relative to that experienced on line 52, i.e., a negative response. Similarly, applying a negative input a negative stored weight pattern results in a positive output response.

To recapitulate, in accordance with the conventions described above, a positive input applied to a positive weight produces a positive response; a negative input applied to a positive weight produces a negative response; a negative input applied to a negative weight produces a positive response; and a positive input applied to a negative weight results in a negative response. Thus, the cell of FIG. 6 delivers a full four-quadrant multiply, providing both excitatory and inhibitory connections.

It is appreciated that with respect to the discussion of FIGS. 2-6, the capacitors associated with the output current summing lines must be pre-charged before each new input pulse sequence or association cycle is applied.

Full incremental learning capabilities may be incorporated into the cell of FIG. 6 by including select transistors coupled to the sources of each of the floating gate transistors 40-43. These transistors would be arranged in accordance with the teachings of FIG. 3 and FIG. 5. That is, each select device would have its gate coupled to a voltage select line and its source coupled to a separate programming potential line. Programming and erasing may then take place in a manner as described above in connection with FIGS. 2-5. Such a circuit configuration employing select transistors for programming and erasing ease is shown in FIG. 7.

FIG. 7 illustrates n-channel select transistors 60-63 coupled to floating gate transistors 40-43, respectively. Voltage select line 67 is coupled to the gates of transistor 60 and 61 while select line 68 is coupled to the gates of transistor 62 and 63. Transistor 60 and 62 have their sources coupled to line 64, while devices 61 and 63 have their sources coupled to line 65. Lines 64 and 65 provide appropriate potentials to the sources of transistors 40-43 during programming, erasing and normal read operations.

DISCUSSION OF THE EMBODIMENTS OF FIGS. 8-10

The synapse cells of FIGS. 6 and 7 are not without certain drawbacks. Consider the situation in which each of the floating gate transistors 40-43 in FIG. 7 comprises pure EEPROM floating gate devices and it is desired to program transistor 42. (EEPROM devices are sometimes preferred for applications in which lower current is needed or a truly 5-volt operating environment is required. Flash EPROM devices, on the other hand, are often subject to large current surges; for example, when an entire column is switched. EPROMs also generally operate with larger voltages). To program device 42, line 51 (connected to the control gate) is raised to a programming potential $V_{PP}$. In the preferred embodiment $V_{PP}$ is approximately 15-18 volts. The drain is then grounded while the source is floated by taking $V_{select2}$ (line 68) to a low potential. This causes electrons to tunnel from the drain region to the floating gate of device 42 through the thin oxide region near the drain.

A problem arises due to the fact that the control gates of devices 42 and 43 are coupled to the same input line 51. Since line 51 is at programming potential $V_{PP}$ during programming of device 42, device 43 is subjected to the same potential. As a result, the programming state of device 43 is severely disturbed during any attempt to program device 42.

Similarly, to erase device 42 the control gate (via line 51) is grounded while the drain (connected along line 52) is taken to programming potential $V_{PP}$. This results in disturbance of the programming state of neighboring device 40 since its drain is also coupled to line 52 and the voltage on input line 50 is generally made to track that of line 51 during programming/erasing operations.

In sum, to program or erase a single EEPROM transistor and the synapse cell of either FIG. 6 or FIG. 7 requires that the neighboring transistors in the cell undergo severe disturb conditions. The disturb conditions for the cell of FIG. 7 when programming or erasing device 42 are summarized in Table 1 below. Obviously, programming or erasing of the other device in the cell of FIGS. 6 or 7 would produce corresponding disturbances in neighboring devices.

TABLE 1

|  | $Q_{40}$ | $Q_{42}$ | $Q_{41}$ | $Q_{43}$ |
|---|---|---|---|---|
| Program | No Disturbance | Gate = Vpp<br>Drain = 0V | No Disturbance | Gate = Vpp<br>Drain = 0V |
| Erase | Gate = 0V<br>Drain = Vpp | Gate = 0V<br>Drain = Vpp | No Disturbance | No Disturbance |

With reference now to FIG. 8, the currently preferred embodiment of the present invention is shown. The cell of FIG. 8 comprises four identical EEPROM transistors 70-73, each including a dual control gate structure for reducing the disturb voltage conditions within the cell by a factor of approximately two. Note that devices 70-73 are shown without an associated select transistor. Instead their sources are shown coupled directly to ground. It is appreciated that select transistors may be incorporated into the cell of FIG. 8 in a manner similar to that described in FIG. 7.

In FIG. 8, transistor 70 includes a first control gate 74 which is spatially oriented over the field region of the device. Control gate 74 is coupled to input line 85, labeled $X_{i1}$, which is also coupled to control gate 78 of device 72. Likewise, control gates 76 and 80 of devices 71 and 73, respectively, are coupled to input line 86, labeled $X_{j2}$. (Gates 76, 78 and 80 are also oriented over the field region of their respective transistors.)

A second control gate 75, oriented mostly over the channel region of transistor 70, is connected to input line 90, labeled $X_{i1}$, which is also coupled to the control gate 77 of transistor 71. Control gate 79 and 81 of devices 72 and 73, respectively, are coupled to input line 91, labeled $X_{j2}$. (Gates 77, 79 and 81 are also oriented mostly over the channel region of their respective transistors.) Analog current summing lines 87 and 88 are shown coupled to the drains of devices 70, 72 and 71, 73, respectively.

To aid in the understanding of the operation of the cell of FIG. 8, consider the case in which transistor 72 is first programmed and then erased.

To program transistor 72, line 85 (connected to control gate 78) and line 91 (connected to control gate 79) are both taken to a high programming potential $V_{PP}$. The drain of device 72 is taken to a low potential by grounding line 87; lines 86, 88 and 90 are also grounded. Taking both control gates 78 and 79 to a high positive potential causes electron injection into the floating gate by Fowler-Nordheim tunnelling through the thin oxide located over the N+ drain region.

The other devices receiving potential $V_{PP}$ at their control gates include transistors 70 and 73. Due to the programming of device 72, transistor 70 has its control gate 74 at potential $V_{PP}$ while transistor 73 has its control gate 81 at that same potential. However, both transistors 70 and 73 have their other control gate (i.e., 74 and 80, respectively) at ground potential. The total potential applied to both control gates of devices 70 and 73 is therefore reduced by a factor of approximately two. This reduction in applied potential is sufficient to virtually eliminate disturbance of the electrical charges stored on the floating gates of these devices. Thus, the sensitivity of transistors 70 and 73 (as well as transistor 71) to disturbances caused by the programming of transistor 72 is substantially reduced. Dual gate transistors which receive a high potential on one control gate while the other remains low are sometimes referred to as operating in a half-selection mode.

Consider now the situation in which transistor 72 is erased. To erase transistor 72 line 87 is taken to the potential $V_{PP}$ while lines 85 and 91, coupled to control gates 78 and 79, respectively, are grounded. This causes electrons residing on the floating gate of transistor 72 to tunnel across the thin oxide region and back into the drain of device 72. To reduce a possible disturbance to the other transistors in the cell during the erasing of transistor 72 lines 88 and 86 are gounded. This eliminates any possible disturb condition to transistor 73.

To remove the disturbance to transistor 70, line 90 (connected to control gate 75) is raised to the programming potential $V_{PP}$. Again, this markedly reduces the disturbance to device 70. Note that the application of $V_{PP}$ to line 90 also places gate 77 of transistor 71 at the programming potential. However, since line 86 is normally grounded when erasing device 72, transistor 71 remains in the half-selection mode—meaning, of course, that disturbance to device 71 is essentially non-existent.

Realize also that during read operations of the synapse cell of FIG. 8 the $X_j$ and $X_i$ lines could be coupled together. That is, the input pulse may be simultaneously applied to more than one input voltage line to sense the cell of FIG. 8. Alternatively, a user could apply a voltage reference such as $V_{CC}$ to the vertical lines $X_j$ while using the horizontal lines $X_i$ as the signal lines for the input voltage vectors. By way of example, if lines 85 and 86 are placed at $V_{CC}$, then the input voltage is applied to either lines 90 or 91.

Moreover, the concept of using a dual control gate transistor to prevent programming disturbance could also be extended to any of the synapse cells of FIGS. 2–7. Such an implemenation, of course, would involve splitting the input lines into $X_i$ and $X_j$ components.

Thus, splitting the input lines to accommodate the dual control gate structure of the floating gate devices produces an improved synapse cell which is immune to disturb conditions which normally arise during programming and erasing of the individual transistors. The voltage levels associated with the programming and erasing of device 72 are provided below in Table 2.

TABLE 2

|  | $Q_{70}$ | $Q_{71}$ | $Q_{72}$ | $Q_{73}$ |
|---|---|---|---|---|
| PROGRAM |  |  |  |  |
| Gate i: | 0 | 0 | $V_{PP}$ | $V_{PP}$ |
| Gate j: | $V_{PP}$ | 0 | $V_{PP}$ | 0 |
| Drain: | 0 | 0 | 0 | 0 |
| ERASE |  |  |  |  |
| Gate i: | $V_{PP}$ | $V_{PP}$ | 0 | 0 |
| Gate j: | 0 | 0 | 0 | 0 |
| Drain: | $V_{PP}$ | 0 | $V_{PP}$ | 0 |

Table 2 provides a good illustration of how half-selection mode in a dual gate structure may be used to practically eliminate disturbance in neighboring floating gate transistors.

It is also understood that the concept of using a dual control gate transistor to prevent programming disturbance could also be extended to any of the synapse cells of FIGS. 2–7. Such an implementation, of course, would involve splitting the input lines into $X_i$ and $X_j$ components.

Referring now to FIG. 9, a top view of one of the dual gate transistors 70–73 of FIG. 8 is shown. In the preferred embodiment, transistors 70–73 are fabricated using a process flow such as that described in co-pending application entitled "Process for Simultaneously Fabricating EEPROM Cell and Flash EPROM Cell", Ser. No. 274,420, filed Nov. 21, 1988, which application is assigned to the assignee of the present invention and is herein incorporated by reference. The only fundamental deviation from the process described in the above-referenced co-pending application involves the separation of the control gate into two distinct sections 75 and 74.

The preferred embodiment of FIG. 9 includes drain contact 102 and source contact 103. The floating gate is represented by a first polysilicon layer 95. The control gate comprises second polysilicon layers 75 and 74. The thin tunnel oxide region is represented in FIG. 9 by the rectangle 97. The active region for the device is defined by dashed line 96, while the intersection of active region 96 and layer 95 in the area beyond oxide 97 (see FIG. 10B) defines the channel 105 for the transistor. In the actual device implementation the square tunnel region formed by the intersection of layers 75 and 97 is approximately 1.0 microns square ($um^2$) in area. The total unit cell size of the tranistor of FIG. 9 is approximately 140 $um^2$.

Note that poly layer 75 corresponds to the $X_{i1}$ input while poly layer 74 corresponds to the $X_{j1}$ input of transistor 70. In the preferred embodiment, the control gate capacitance ratio between gates 75 and 74 is approximately 60:40, respectively. It is believed, however, that a wide range of capacitance ratios may be used to prevent disturbance of adjacent transistors. For instance, a capacitance ratio of 50:50 or 40:60 should produce reasonable results.

Referring now to FIGS. 10A and 10B, two cross-sectional view of the dual control gate EPROM device of FIG. 9 are shown. FIG. 10A is a cross-sectional view taken along cut line A—A', while FIG. 10B is a cross-sectional view taken along line B—B'. As shown in FIGS. 10A and 10B, EEPROM transistors 70–73 each comprise an N+ source region 99 spacedapart from an N+ drain region 98. Floating gate 95 comprises a polysilicon gate insulated from substrate 101 in one area of the device by field oxide 100 (see FIG. 10A), and in another area of the device by a thin gate oxide 104 (FIG. 10B). Floating gate 95 extends completely across channel 105 from the edge of source region 99 and overlaps a portion of drain region 98, as shown in FIG. 10B. Tunnelling of electrons takes place through the very thin silicon dioxide layer 97 which, in the preferred embodiment, is approximately 110 Å thick. Tunnel oxide region 97 is oriented directly over the drain region 98 of the device. A thin dielectric (e.g., silicon dioxide) separates the floating gate 95 from control gate members 75 and 74. Control gate 74 is oriented over field oxide 100 while control gate 74 is oriented primarily over the channel region of the transistor as well as above tunnel region 97. EEPROM devices 70–73 are each surrounded by field-oxide region 100.

Whereas many alternations and modifications of the present invention will no doubt become apparent to a person of oridinary skill in the art after having read the foregoing description, it is to be understood that the particular embodiments shown and described by way of illustration are in no way intended to be considered limiting. For example, although this disclosure has shown a particular way of implementing a dual control gate device structure, other implementations are possible. Therefore, reference to the details of the preferred embodiments are not intended to limit the scope of the claims which themselves recite only those features regarded as essential to the invention.

Thus an improved synapse cell employing a dual-gate transistor structure has been disclosed.

We claim:

1. A synapse cell for discharging a neural summing line in an associative network, the discharge rate being a function of the duration of an input voltage pulse and a stored weight, said cell comprising a dual-gate transistor having a floating gate for storing said stored weight, a source coupled to a reference potential, a drain coupled to said neural summing line, a first control gate coupled to a first input line and a second control gate coupled to a second input line, said first and/or said input lines coupling said input voltage pulse to said dual-gate transistor to cause a current to flow from said drain to said source, said current discharging said neural summing line.

2. The synapse cell of claim 1, wherein said stored weight is programmed onto said floating gate by raising said first and said second control gates to a high positive potential while simultaneously grounding said drain so as to cause tunnelling of electrons from said drain to said floating gate.

3. The synapse cell of claim 1, wherein said weight is erased from said floating gate by raising said drain to a high positive potential while simultaneously grounding said first and second control gates so as to cause tunnelling of electrons from said floating gate to said drain.

4. The synapse cell of claim 1 wherein said drain floats during erasing of said weight.

5. The synapse cell according to claim 1, wherein said input voltage pulse is binary in nature.

6. In an associative network, an adaptive synapse cell for providing both excitatory and inhibitory connections between first and second input voltage lines in a neural summing device, said cell comprising:

a first dual-gate transistor having a first floating gate for storing a first charge, a first drain coupled to a first output summing line and first and second control gates coupled to first and second input voltage lines, respectively, said first output summing line having a first capacitance associated therewith;

a second dual-gate transistor having a second floating gate for storing a second charge, a second drain coupled to a second output summing line and third and fourth control gates coupled to said first and a third input voltage lines, respectively, said second output summing line having a second capacitance associated therewith, the difference between said first and said second charges difining a weight;

said first and second output summing lines providing a differential signal to said neural summing device in response to an input voltage pulse of a certain duration applied to at least one of said first, second or third input voltage lines, the magnitude and sign of said differential signal being directly proportional to said certain duration and said weight.

7. The synapse cell of claim 6 wherein said input voltage pulse is applied to said first input voltage live while said second and third input voltage lines are set at a reference potential.

8. The synapse cell of claim 6, wherein said first charge is programmed onto said first floating gate by raising said first and second input voltage lines to a high positive potential while simultaneously grounding said first output summing line so as to cause tunnelling of electrons from said first drain to said first floating gate, said third input voltage line being grounded during programming of said first dual-gate transistor so as to substantially eliminate the disturbance of said second charge on said second floating gate.

9. The synapse cell of claim 6, further comprising:

a third dual-gate transistor having a third floating gate for storing a third charge, a third drain coupled to said first output summing line and fifth and sixth control gates coupled to said second and a fourth input voltage lines, respectively;

a fourth dual-gate transistor having a fourth floating gate for storing a fourth charge, a fourth drain coupled to said second output summing line and seventh and eighth control gates coupled to said third and said fourth input voltage lines, respectively; and wherein said first charge is erased from said first floating gate by raising said first output summing line to a high positive potential while simultaneously grounding said first and second input lines so as to cause tunnelling of electrons from said first floating gate to said first drain.

10. The synapse according to claim 9, wherein said fourth input line is held at a high positive potential during erasing to prevent disturbance of said third charge on said third floated gate.

11. The synapse according to claim 6, wherein said input voltage pulse is binary in nature.

12. A synapse cell for providing both excitatory and inhibitory connections between first, second, third and fourth input lines and first and second output summing lines, said cell comprising:

a first dual-gate transistor having a floating gate, a source coupled to a reference potential, a drain coupled to said first output summing line, and first and second control gates coupled to said first and third input lines, respectively;

a second dual-gate transistor having a floating gate, a source coupled to a reference potential, a drain coupled to said first output summing line, and third and fourth control gates coupled to said third and second input lines, respectively;

a third dual-gate transistor having a floating gate, a source coupled to a reference potential, a drain coupled to said second output summing line, and fifth and sixth control gates coupled to said fourth and first input lines, respectively;

a fourth dual-gate transistor having a floating gate, a source coupled to a reference potential, a drain coupled to said second output summing line, and seventh and eighth control gates coupled to said fourth and second input lines, respectively;

each of said floating gates storing electrical charges which regulate the current flow through said transistors in such a way that whenever an input voltage of a certain duration is applied to at least one of said input lines a differential output signal is produced across said first and second output summing lines, the magnitude and sign of said differential output signal being directly related to the magnitude of said electrical charges, the weight pattern formed by the difference in said charges between said first, second, third and fourth transistors, and the duration of said input pulse.

13. The synapse cell according to claim 12, wherein said charges are programmed onto said floating gate of said second transistor by raising said second and third input lines to a high positive potential while simultaneously grounding said first output summing line so as to cause tunnelling of electrons from drain to said floating gate.

14. The synapse cell according to claim 13, wherein said first and said fourth input lines, and said second output summing line, are grounded during programming to prevent disturbance of said electrical charges residing on said floating gate of said second, third and fourth transistors.

15. The synapse cell according to claim 14, wherein said charges are erased from said second transistor by grounding said second the third input lines while simultaneously raising said first output line to a high positive potential so as to cause tunnelling of electrons from said floating gate to said drain of said second transistor.

16. The synapse cell according to claim 15, wherein said first input line is raised to a high positive potential while said second output summing line is grounded during erasing to prevent disturbance of said electrical charges on said floating gates of said first, third and fourth transistors.

* * * * *

UNITED STATES PATENT AND TRADEMARK OFFICE
CERTIFICATE OF CORRECTION

PATENT NO. : 4,961,002
DATED : 10/2/90
INVENTOR(S) : Simon M. Tam, Mark A. Holler and Hernan A. Castro It is certified that error appears in the above-indentified patent and that said Letters Patent is hereby corrected as shown below:

| | |
|---|---|
| Col. 2, Line 53 | After "cer" Delete ","  Insert --;-- |
| Col. 4, Line 67 | After the word "tunneling"  Insert --,-- |
| Col. 5, Line 11 | After the word "violet"  Insert --light-- |
| Col. 5, Line 21 | Delete "non-zeo"  Insert --non-zero-- |
| Col. 9, Line 14 | After the word "input"  Insert --to-- |
| Col. 13, Line 44 | Before the first occurrence of "input" insert --second-- |

Signed and Sealed this

Tenth Day of May, 1994

Attest:

BRUCE LEHMAN

*Attesting Officer*  *Commissioner of Patents and Trademarks*